US008046094B2

(12) United States Patent
Wada

(10) Patent No.: US 8,046,094 B2
(45) Date of Patent: Oct. 25, 2011

(54) AUDIO REPRODUCING APPARATUS

(75) Inventor: Naoyuki Wada, Fuchu (JP)

(73) Assignee: Kabushiki Kaisha Toshiba (JP)

( * ) Notice: Subject to any disclaimer, the term of this patent is extended or adjusted under 35 U.S.C. 154(b) by 38 days.

(21) Appl. No.: 12/563,049

(22) Filed: Sep. 18, 2009

(65) Prior Publication Data

US 2010/0168883 A1 Jul. 1, 2010

(30) Foreign Application Priority Data

Dec. 26, 2008 (JP) ................................ 2008-333140

(51) Int. Cl.
*G06F 17/00* (2006.01)
*H04H 40/00* (2008.01)
*H03G 3/00* (2006.01)

(52) U.S. Cl. .......................... 700/94; 455/3.06; 381/107

(58) Field of Classification Search .................... 700/94; 455/3.06; 360/61, 62; 369/2, 3; 725/92, 725/94, 115, 145; 386/241, 287, 337; 381/94.5, 381/104, 107
See application file for complete search history.

(56) References Cited

U.S. PATENT DOCUMENTS

| | | | | |
|---|---|---|---|---|
| 5,333,153 | A * | 7/1994 | Brown et al. | 375/351 |
| 5,768,535 | A * | 6/1998 | Chaddha et al. | 709/247 |
| 5,832,024 | A * | 11/1998 | Schotz et al. | 375/134 |
| 6,775,654 | B1 | 8/2004 | Yokoyama et al. | |
| 6,819,641 | B1 * | 11/2004 | Terao et al. | 369/47.16 |
| 2005/0190872 | A1 * | 9/2005 | Seong et al. | 375/354 |

FOREIGN PATENT DOCUMENTS

| | | |
|---|---|---|
| JP | 07-336311 | 12/1995 |
| JP | 2000-075873 | 3/2000 |
| JP | 2000-75873 | 3/2000 |
| JP | 2002-320156 | 10/2002 |
| JP | 2005-157045 | 6/2005 |
| JP | 2007-10855 | 1/2007 |
| WO | WO 2008138047 A1 * | 11/2008 |

OTHER PUBLICATIONS

Notification of Reason for Refusal mailed by Japan Patent Office on Dec. 1, 2009 in the corresponding Japanese Patent Application No. 2008-333140.

* cited by examiner

*Primary Examiner* — Davetta Goins
*Assistant Examiner* — Daniel Sellers
(74) *Attorney, Agent, or Firm* — Knobbe, Martens, Olson & Bear, LLP

(57) ABSTRACT

An audio reproducing apparatus includes: a decoding module configured to perform a decoding process on a digital broadcast signal demodulated by a demodulating module and generate an audio signal; a generating module configured to generate suspension audio data based on the audio signal of a first given time period, the audio signal being output from the decoding module; a switching module configured to switch a source of the audio signal to be output from the audio output module between the decoding module and a storage module; and a control module configured to control the switching module to switch the source to the storage module for causing an audio output module to output selected suspension audio data to be faded-out when a suspension of the decoding by the decoding module is occurred, the selected suspension audio data being the suspension audio data stored immediately before the suspension.

4 Claims, 6 Drawing Sheets

AUDIO REPRODUCING APPARATUS

CROSS REFERENCE TO RELATED APPLICATION(S)

The present disclosure relates to the subject matters contained in Japanese Patent Application No. 2008-333140 filed on Dec. 26, 2008, which are incorporated herein by reference in its entirety.

FIELD

The present invention relates to an audio reproducing technology and to an audio reproducing apparatus for suitably reproducing digital audio data.

BACKGROUND

In recent years, various apparatus which are equipped with a tuner unit for receiving digital broadcasts such as digital TV broadcasts and digital radio broadcasts, have been introduced into the market. Portable apparatus such as notebook personal computers and cell phones have come to be equipped with such a tuner unit to allow users to receive digital broadcasts via wireless transmission path even while a user is out of the door and while the user is moving.

Although capable of receiving digital broadcasts during movement, these apparatus sometimes suffer from a loss of data in a wireless transmission path. This is because broadcast waves are interrupted by an obstacle such as a building, a tree, a bridge, or a tunnel as the apparatus passes the shadow of the obstacle during the movement.

When errors occur in video data or audio data due to a loss of data, picture disorder or a sound interruption occurs in the apparatus. An uncomfortable feeling of the viewer due to picture disorder among these problems can be relieved relatively easily and effectively by, for example, maintaining a still image.

In contrast, it is difficult to reduce an uncomfortable feeling due to a sound interruption by simple processing such as mere muting.

In connection with the above, an audio decoding device is known which can suppress degradation in auditory feeling by reducing a sound interruption feeling caused by muting. An example of such device is disclosed in JP-A-7-336311. This device can reduce an uncomfortable feeling due to a sound interruption by replacing immediately preceding coding parameters with coding parameters of a past silent frame when code errors are detected in consecutive frames.

In conventional techniques as typified the one disclosed in the publication, JP-A-7-336311, attention is focused on how to compensate for, that is, whether to repair or to replace, errors in audio data. These replacement (interpolation) techniques are effective in the case where errors in audio data last only a very short time. However, when errors in audio data last long time because the apparatus receiving a broadcast enters a tunnel, managing to compensate for a silent portion may produce an unnatural sound contrary to the intention. As such, at present, the replacement techniques for compensating for a silent portion are not necessarily used effectively.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

An embodiment of the audio reproducing apparatus according to the present invention will be hereinafter described with reference to the accompanying drawings.

In the embodiment, the audio reproducing apparatus according to the invention is implemented as a battery-powered, portable notebook personal computer.

Figure 1:
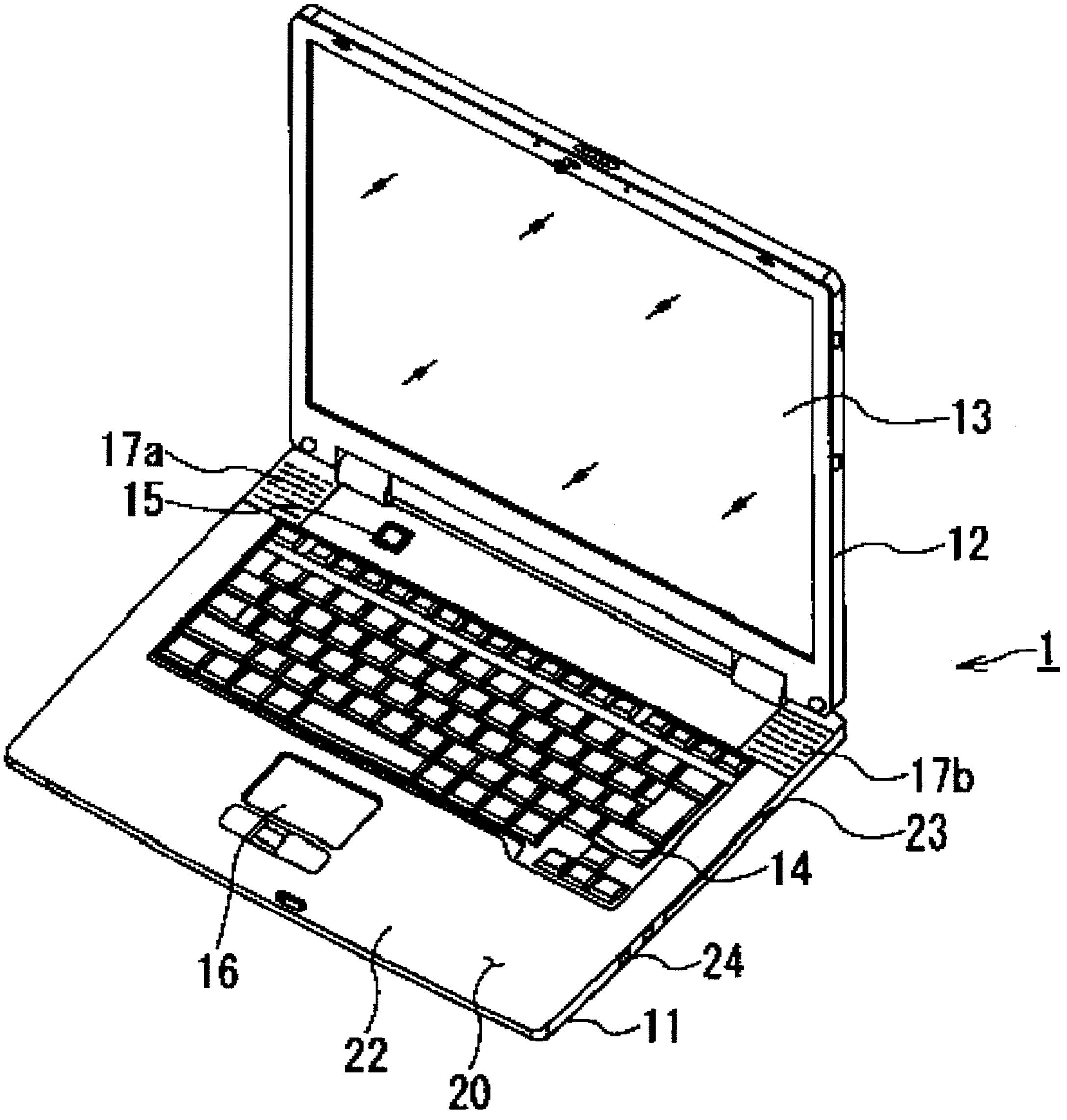
FIG. 1 is a perspective view, in a state that a display unit is opened, of a notebook personal computer (computer) which is an embodiment of the audio reproducing apparatus according to the present invention.

FIG. 1 is a perspective view, in a state that a display unit 12 is opened, of a notebook personal computer (hereinafter simply called "PC") 1 which is an embodiment of the audio reproducing apparatus according to the invention.

The main body of the PC 1 is provided with a base unit 11 and the display unit 12. The display unit 12 has a display device, such as an LCD (liquid crystal display) panel 13. The display screen of the LCD panel 13 is disposed approximately at the center of the display unit 102.

The display unit 12 is connected to and supported by a rear end portion of the base unit 11. The display unit 12 as a second body is attached so as to be rotatable between an open position where it exposes the top face 20 of the base unit 11 and a closed position where it covers the top face 20 of the base unit 11. The base unit 11 has a thin, box-shaped body, and a keyboard 14, a power button 15 for powering on or off the PC 1, and a touch pad 16 are arranged on its top face 20.

Two speakers 17*a* and 17*b* are arranged on a rear end portion of the top face 20 of the base unit 11 so as to be directed upward. The speakers 17*a* and 17*b* function as an L-channel speaker and an R-channel speaker, respectively.

A side surface 23 of the base unit 11 is provided with a headphone jack 24. When the plug (not shown) of a headphone is inserted into the headphone jack 24, audio can be output from the headphone as from the speakers 17*a* and 17*b*.

Figure 2:
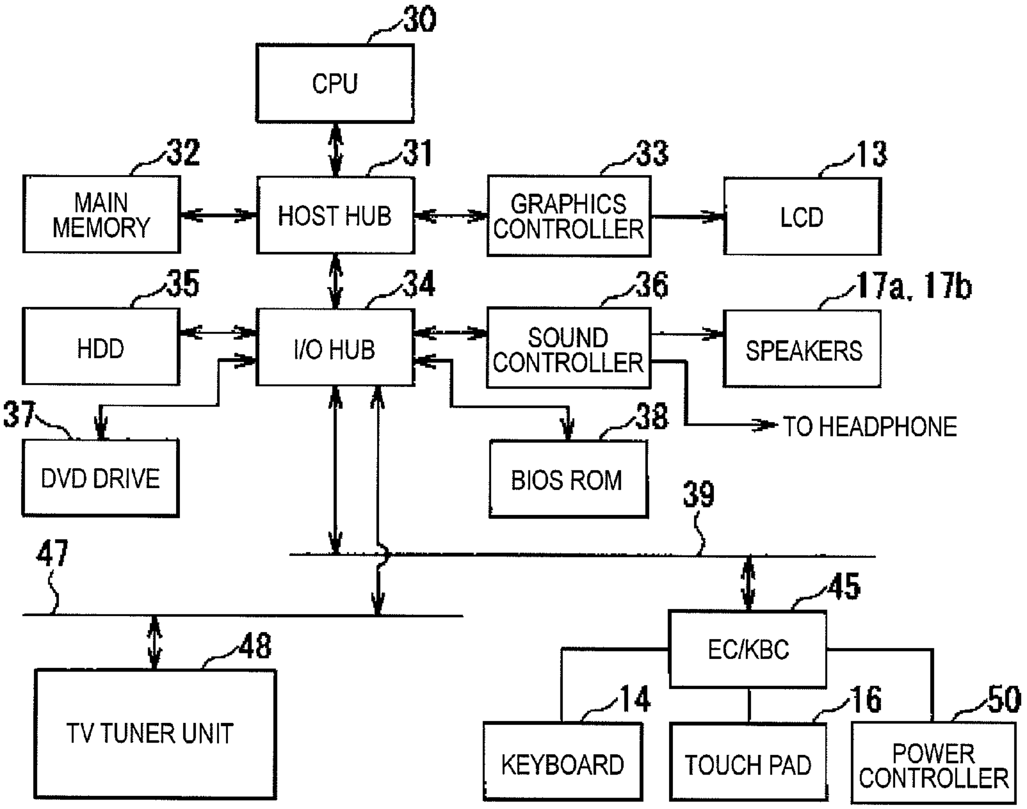
FIG. 2 is a block diagram showing an example system configuration of the computer according to the embodiment.

FIG. 2 is a block diagram showing a system configuration of the PC 1 according to the embodiment.

The PC 1 according to the embodiment is mainly equipped with a CPU 30, a host hub 31, a main memory 32, a graphics controller 33, the LCD panel 13, an I/O hub 34, a hard disk drive (HDD) 35, a sound controller 36, the speakers 17*a* and 17*b*, a DVD drive 37, a BIOS-ROM 38, an LPC bus 39, an embedded controller/keyboard controller (EC/KBC) 45, the keyboard 14, the touch pad 16, a power controller 50, a PCI bus 47, and a TV tuner unit 48.

The CPU 30 is a processor which controls the operation of the PC 1. The CPU 201 runs an operating system and various programs including utility programs that are loaded onto the main memory 32 from the HDD 35.

The host hub 31 is abridge device which connects a local bus of the CPU 30 and the I/O hub 34. The host hub 31 incorporates a memory controller for controlling the main memory 32. The graphics controller 33 which controls the LCD panel 13 is connected to the host hub 31.

The I/O hub 34 functions as an I/O controller which controls various I/O devices connected to the LPC bus 39 and the PCI bus 47. The I/O hub 34 incorporates an IDE for controlling the HDD 35 and the DVD drive 37. The I/O hub 34 controls access to the BIOS-ROM 38 and the sound controller 36 for controlling the speakers 17*a* and 17*b*. The BIOS-ROM 38 is a flash ROM for storing a system BIOS in an electrically rewritable manner.

The EC/KBC 45 is a one-chip microcomputer in which an embedded controller (EC) for communicating with the power controller 50 which controls the power supply to the individual sections of the PC 1 and a keyboard controller for controlling the keyboard 14 and the touch pad 16 are integrated together. The PC 1 can be powered by either of a power supplied from a battery (not shown) and a power supplied from an external power source (not shown). The power controller 50 communicates, to the EC/KBC 45, power information such as the presence/absence of power supply from the external power source and the residual energy of the battery.

The TV tuner unit 48 receives digital TV broadcast data, performs demodulation and decoding on the received data, and outputs resulting data to the PCI bus 47. Among digital TV broadcast data that are output to the PCI bus 47 from the TV tuner unit 48, video data is supplied to the LCD panel 13 via the graphics controller 33. Audio data is supplied to the speakers 17*a* and 17*b* via the sound controller 36. While the digital TV broadcast data are being recorded, the video data and the audio data are output to the HDD 35 or the DVD drive 37.

Figure 3:
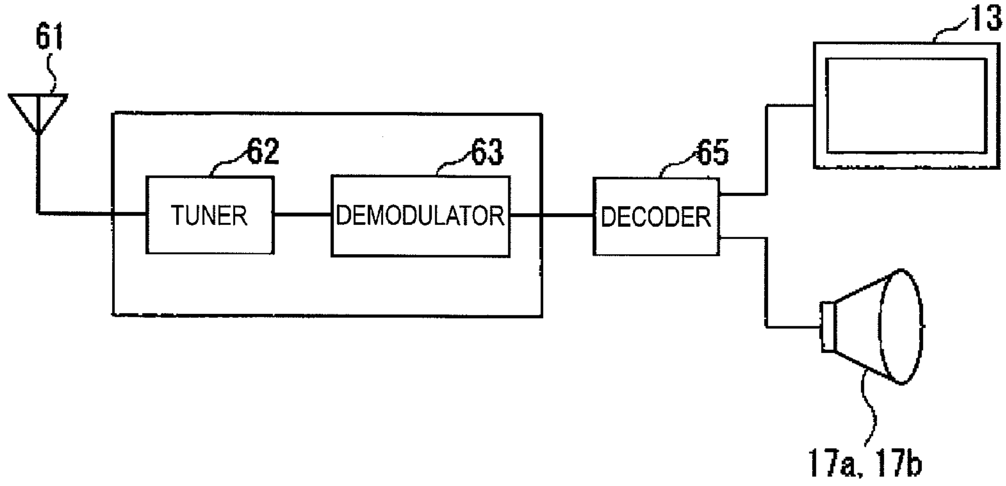
FIG. 3 is a functional block diagram of a TV tuner unit of the computer according to the embodiment.

FIG. 3 is a functional block diagram of the TV tuner unit 48.

In the embodiment, the TV tuner unit 48 functions as a receiver module for receiving a digital broadcast signal including an audio signal and a demodulating module the digital broadcast signal received by the receiver module.

A signal that is transmitted over a wireless transmission path and input via an antenna 61 is converted into an IF signal by a tuner 62, which is output at a given level from an AGC (automatic gain control) circuit which is incorporated in the tuner 62. A demodulator 63 converts a digital broadcast signal that is input in an analog signal format into a signal having a digital signal format and performs error detection and correction. The demodulator 63 outputs ordinary digital data that can be expressed by 0s and 1s.

The digital data that is output from the demodulator 63 is supplied to an MPEG de coder 65 as a TS (transport stream) signal.

Figure 4:
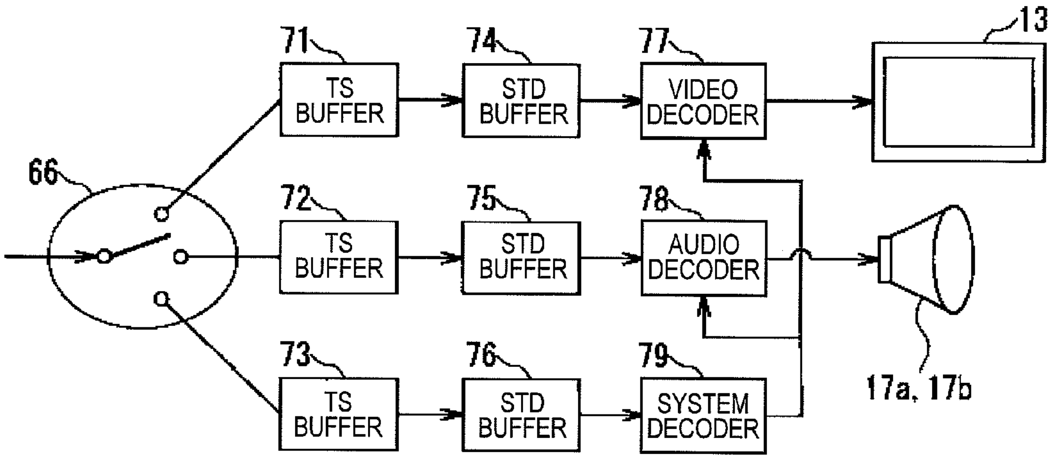
FIG. 4 is a functional block diagram showing the configuration of an MPEG decoder of the computer according to the embodiment.

FIG. 4 is a functional block diagram showing the configuration of the MPEG decoder 65 of the PC 1 according to the embodiment.

In the embodiment, the MPEG decoder 65 functions as a decoding module for decoding a digital broadcast signal demodulated by the demodulating module and thereby outputting an audio signal.

The TS signal produced by the demodulator 63 is separated into respective streams as a video TS, an audio TS, and a system TS by a demultiplexing module (switch 66). Data of the TSs thus separated from each other are accumulated in respective TS buffers 71-73. The accumulated data are output from the TS buffers 71-73 in the same order as the input order, converted into ESs (elementary streams), and accumulated in respective STD (system target decoder) buffers 74-76.

System information is extracted by a system decoder 79 from data that is readout from the STD buffer 76, and pieces of information that are necessary for video decoding and audio decoding are sent to a video decoder 77 and an audio decoder 78, respectively. If necessary, the system decoder 79 controls the video decoder 77, the audio decoder 78, and the switch 66 based on an instruction received through the keyboard 14, for example.

The video decoder 77 receives a video ES from the STD buffer 74 and decodes it into video data, that is, a video signal. The audio decoder 78 receives an audio ES from the STD buffer 75 and decodes it into audio data, that is, an audio signal.

In general, video data and audio data that are used in digital broadcast are compressed. Therefore, input video data and audio data cannot be output-transferred consecutively to the LCD panel 13 and the speakers 17*a* and 17*b*. Instead, data that amount to a given size are collected and then the collected data are expanded and output.

In the case of video data, data portions may actually be output to the LCD panel 13 in different order than are received and output to the video decoder 77. Therefore, the times necessary for video data and audio data to become ready for output to the LCD panel 13 and the speakers 17*a* and 17*b* may be different from each other.

In view of the above, to synchronize an output video signal and audio signal, time information called a PTS (presentation time stamp) is added to each video data and each audio data. By virtue of the addition of PTSs, video data and audio data can be output when a clock (not shown) of the MPEG decoder 65 comes to correspond to a PTS.

Next, a description will be made of the configuration of the audio decoder 78 of the MPEG decoder 65. The audio decoder 78 according to the embodiment is equipped with an audio data generating module 80 which generates suspension audio data and restart audio data and outputs them when necessary.

Figure 5:
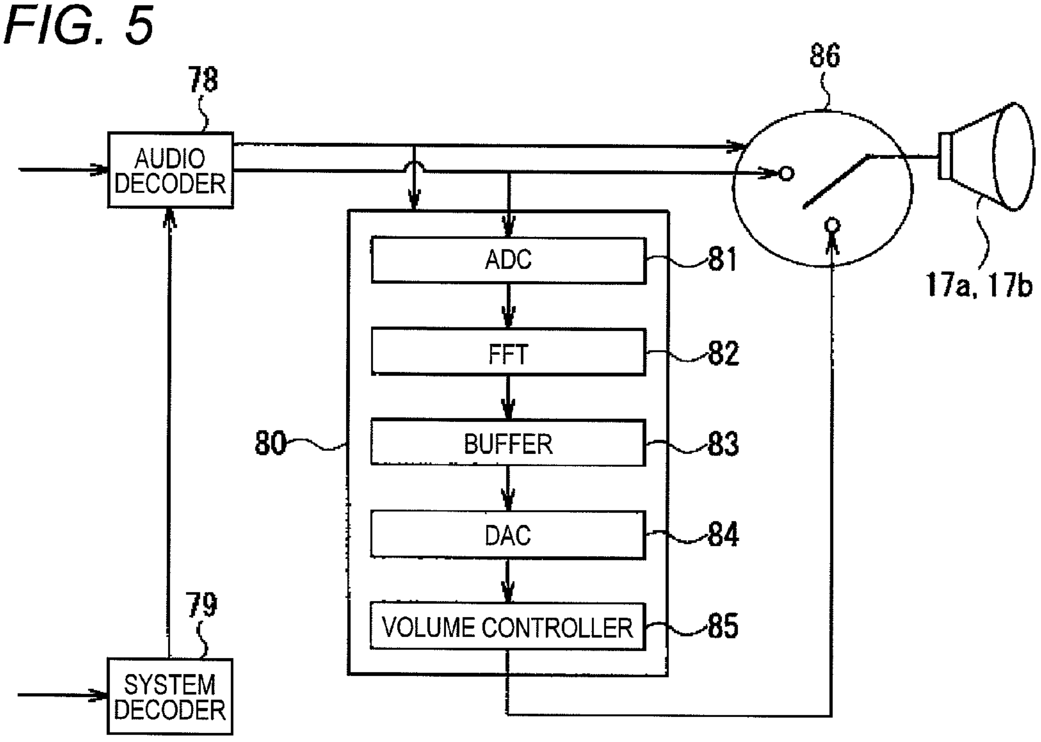
FIG. 5 is a functional block diagram showing the configuration of an audio decoder of the MPEG decoder.

FIG. 5 is a functional block diagram showing the configuration of the audio decoder 78 of the MPEG decoder 65.

An audio signal that is output from an audio decoder 78 is supplied to the speakers 17*a* and 17*b* and output for the user of the PC 1. At the same time, the audio signal is supplied to the audio data generating module 80.

The audio data generating module 80 is equipped with an A/D converter (ADC) 81, a data generating module (FFT) 82, a buffer 83, a D/A converter (DAC) 84, and a volume controller 85.

The A/D converter 81 converts an audio signal of a given time period that is output from the audio decoder 78 into an audio signal having a digital signal format.

The data generating module 82 performs a frequency analysis on the audio signal of the given time period by FFT (fast Fourier transform). The data generating module 82 generates the suspension audio data or the restart audio data having frequency components obtained by the frequency analysis. In the embodiment, the data generating module 82 functions as a generating module for generating the suspension audio data and the restart audio data.

The buffer 83 temporarily stores the suspension audio data and the restart audio data generated by the data generating module 82. In the embodiment, the buffer 83 functions as a storing module for storing the suspension audio data and the restart audio data.

The D/A converter 84 converts the suspension audio data and the restart audio data stored in the buffer 83 into an audio signal having an analog signal format.

The volume controller 85 adjusts the volume of the audio signal that is output from the D/A converter 84. The audio signal that is output from the volume controller 85 is supplied to the speakers 17*a* and 17*b*.

The speakers 17*a* and 17*b* are provided with a switch 86. The switch 86 has a function of switching the supply source of the audio signal to be output from the speakers 17*a* and 17*b* between the audio decoder 78 and the audio data generating module 80. In the embodiment, the switch 86 functions as a switching module.

In the embodiment, the audio decoder 78 having the audio data generating module 80 functions as a control module.

Next, an audio signal output process which is performed by the PC 1 according to the embodiment will be described. First, a description will be made of a process that is performed in a case that normal audio data cannot be obtained due to, for example, a degradation of the receiving situation of a digital TV broadcast signal received by the tuner 62 of the PC 1.

Figure 6:
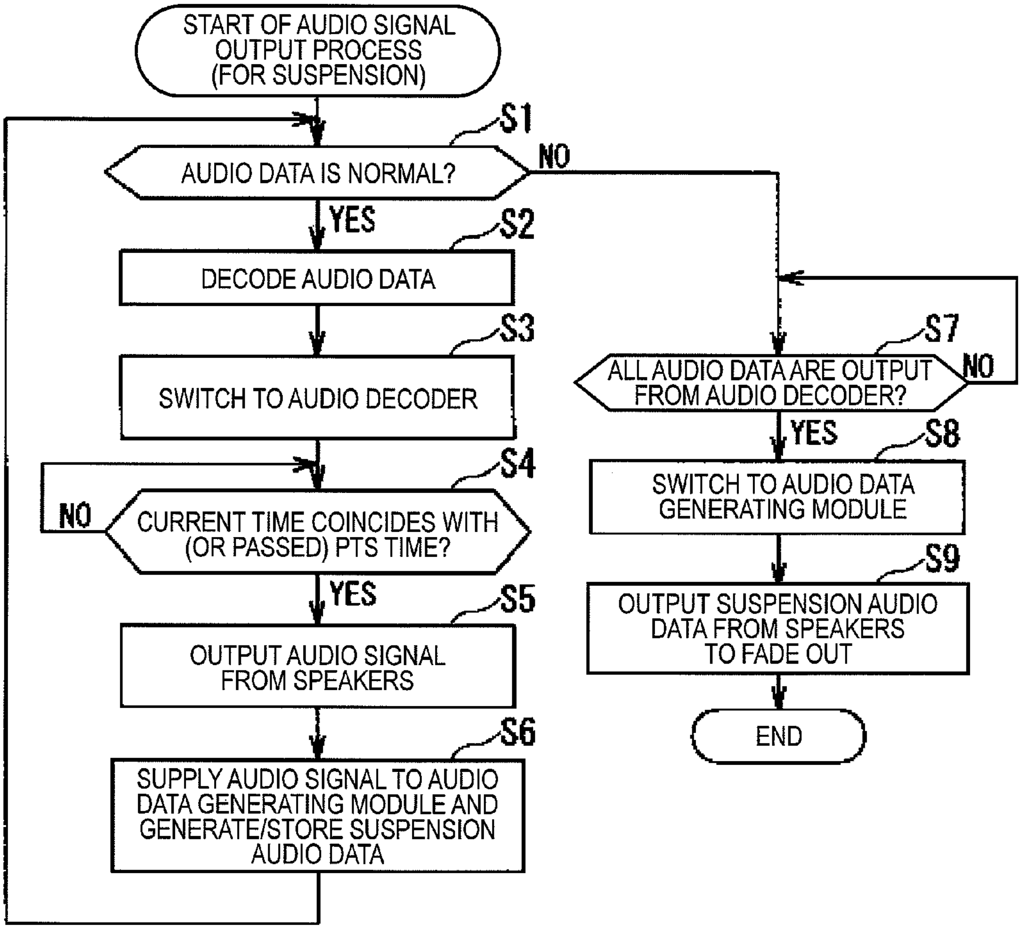
FIG. 6 is a flowchart of an audio signal output process (for suspension) which is performed by the computer according to the embodiment.

FIG. 6 is a flowchart of an audio signal output process (for suspension) which is performed by the PC 1 according to the embodiment.

For example, this audio signal output process is performed when the PC 1 receives a digital TV broadcast signal and outputs a video signal and an audio signal to the LCD panel 13 and the speakers 17*a* and 17*b* or a headphone (not shown) that is connected to the PC 1 via the headphone jack 24.

At step S1, it is determined whether audio data is normal. If it is determined that audio data is normal, at step S2 the audio decoder 78 decodes the audio data and produces an audio signal.

At step S3, the audio decoder 78 switches the switch 86 to the audio decoder side so that the audio signal that is output from the audio decoder 78 can directly be output from the speakers 17*a* and 17*b*, for example.

At step S4, the audio decoder 78 monitors PTSs that are attached to the audio data and determines whether the current time that is based on the clock of the MPEG decoder 65 coincides with or has passed a PTS time. If determined that the current time coincides with or has passed a PTS time, at step S5 the audio decoder 78 causes the speakers 17*a* and 17*b* to output the audio signal. On the other hand, if determined that the current time has not reached a PTS time, the audio decoder 78 stands by until the current time reaches a PTS time.

At step S6, the audio signal that is output from the audio decoder 78 is also output to the audio data generating module 80. The audio data generating module 80 generates and stores suspension audio data. More specifically, when an audio signal of a given time period has been supplied to the audio data generating module 80, the A/D converter 81 converts the audio signal of the given time period into an audio signal having a digital signal format.

The data generating module 82 performs a frequency analysis on the audio signal of the given time period by FFT. Furthermore, the data generating module 82 generates suspension audio data having frequency components obtained by the frequency analysis and stores it in the buffer 83 (temporary storage).

On the other hand, if determined at step S1 that the audio data is not normal and the supply of audio data to be decoded is interrupted, at step S7 the audio decoder 78 determines whether all of an audio signal that has been decoded by the occurrence of interruption has been output from the audio decoder 78.

An event of interruption of supply of audio data occurs when data is lost (errors occur) in a wireless transmission path because, for example, broadcast waves are interrupted by an obstacle such as a building, a tree, a bridge, or a tunnel as the PC 1 passes the shadow of the obstacle.

If determined that not all of the audio signal that has been decoded by the occurrence of interruption has been output from the audio decoder 78, the audio decoder 78 continues the audio signal output until all of the audio signal that has been decoded by the occurrence of interruption is output from the audio decoder 78.

On the other hand, if determined that all of the audio signal that has been decoded by the occurrence of interruption has been output, at step S8 the audio decoder 78 switches the switch 86 to the audio data generating module side (storage module side). Since the switch 86 has thus been switched, at step S9 the audio data stored in the buffer 83 is output to the speakers 17*a* and 17*b* via the D/A converter 84 and the volume controller 85. The D/A converter 84 converts that portion of the suspension audio signal stored in the buffer 83 which was stored immediately before the interruption of the decoding into audio data having an analog signal format. The audio data is output from the speakers 17*a* and 17*b* after its volume is adjusted by the volume controller 85. The volume controller 85 adjusts the volume so that the suspension audio data fades out in a given time period and the audio output is stopped after a smooth decrease in volume.

Figure 7A:
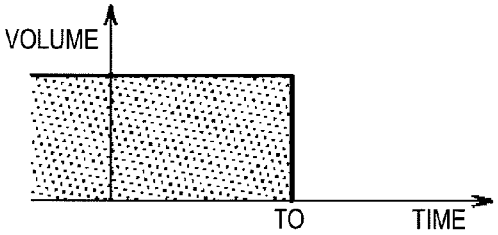
FIGS. 7A and 7B are graphs showing how the audio volume varies when audio output is suspended.
Figure 7B:
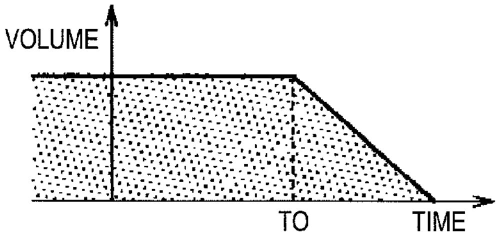

FIGS. 7A and 7B are graphs showing how the audio volume varies when audio output is suspended. The vertical axis represents the volume of audio that is output from the speakers 17*a* and 17*b* and the horizontal axis represents time.

When decoding is suspended and audio signal output from the audio decoder 78 is suspended at time t0, as shown in FIG. 7A, the volume decreases abruptly to a silent state because no waveform is generated if no measure is taken. It is highly likely that this abrupt decrease in volume causes the user of the computer auditory discomfort.

In contrast, in the PC 1 according to the embodiment which is equipped with the audio data generating module 80, even if the audio signal output from the audio decoder 78 is suspended at time t0, as shown in FIG. 7B, suspension audio data that was stored in the buffer 83 immediately before the suspension of decoding can be output so as to fade out.

Therefore, the volume does not vary abruptly and the degree of auditory discomfort that the user suffers due to the variation in the receiving situation can be lowered.

Next, a description will be made of an audio signal output process that is performed when normal audio data comes to be produced because of improvement in the receiving situation after audio output was suspended due to disappearance of normal audio data.

Figure 8:
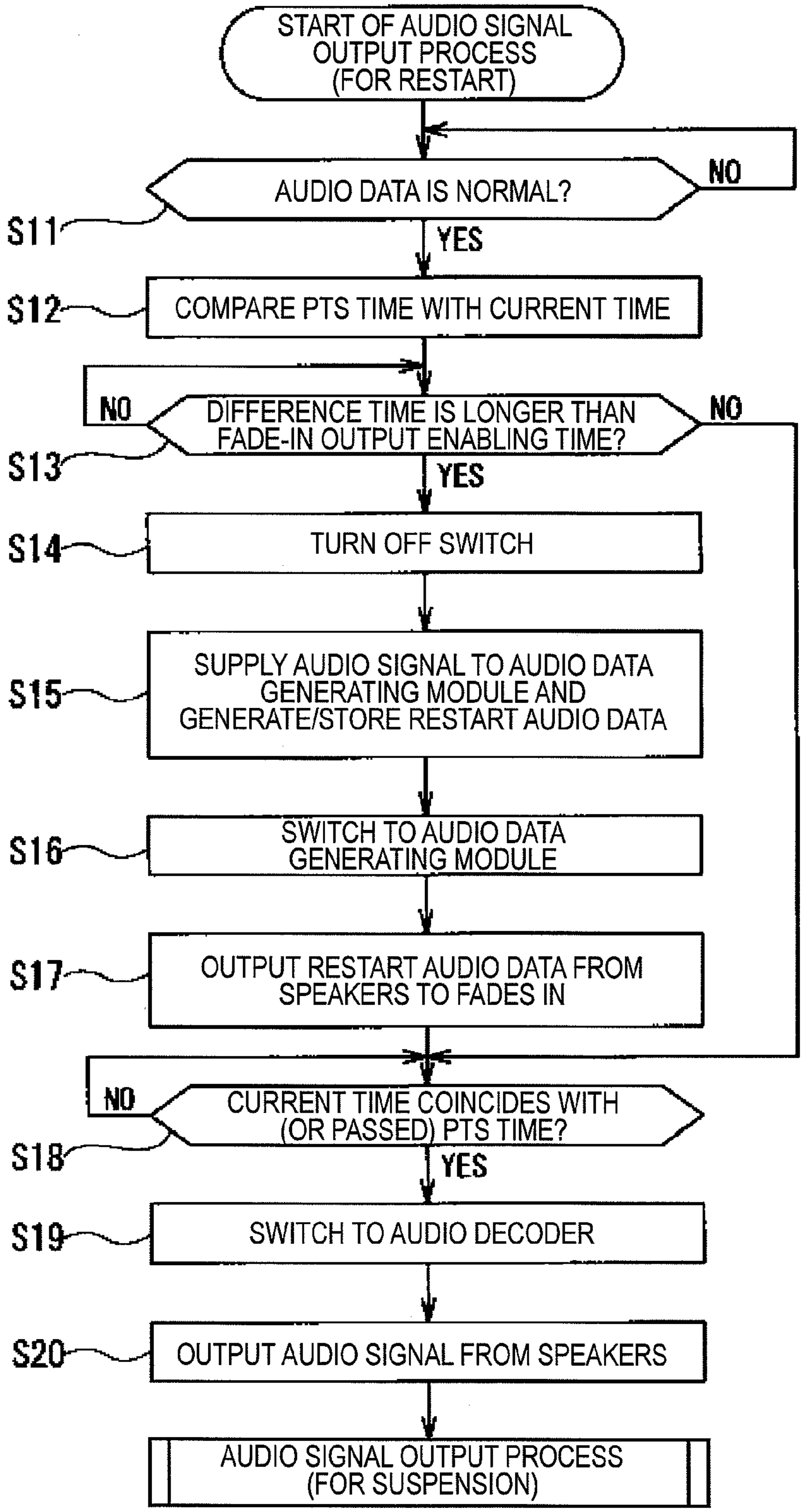
FIG. 8 is a flowchart of an audio signal output process (for restart) which is performed by the computer according to the embodiment.

FIG. 8 is a flowchart of an audio signal output process (for restart) which is performed by the PC 1 according to the embodiment.

At step S11, it is determined whether audio data is normal. If determined that audio data is normal, at step S12, the audio decoder 78 acquires a PTS from the system decoder 79 and acquires a difference time between the current time and the PTS time.

At step S13, the audio decoder 78 determines whether the difference time is longer than a fade-in output enabling time.

The fade-in output enabling time is a predetermined time. More specifically, it is a time that will be taken for restart audio data to be generated based on an audio signal of a given time period that is output immediately after a restart of decoding processing of decoding normal audio data and to be output from the speakers 17*a* and 17*b* so as to fade in. If determined that the difference time is shorter than the fade-in output enabling time, the process moves to step S18. In this case, the fade-in output processing, which is one of main features of the PC 1 according to the embodiment, is not performed when audio signal output is restarted. This is because a sufficient time for the processing cannot be secured.

On the other hand, if determined that the difference time is longer than the fade-in output enabling time, at step S14 the audio decoder 78 turns off the switch 86 so that no audio signal is supplied to the speakers 17*a* and 17*b*.

At step S15, an audio signal is output from the audio decoder 78 to the audio data generating module 80. This audio signal is an audio signal of a given time period starting from the head of an audio signal that is output after the restart of decoding. When the audio signal of the given time period is supplied to the audio data generating module 80, the A/D converter 81 converts the audio signal of the given time period into an audio signal having a digital signal format. The data generating module 82 performs a frequency analysis on the audio signal of the given time period by FFT. Furthermore, the data generating module 82 generates restart audio data having frequency components obtained by the frequency analysis and outputs the restart audio data to the buffer 83.

At step A16, the audio decoder 78 switches the switch 86 to the audio data generating module side (storage module side). Then, at step S17, the restart audio data stored in the buffer 83 is supplied to the speakers 17*a* and 17*b* via the D/A converter 84 and the volume controller 85. The volume controller 85 increases the volume so that the restart audio data fades in within a given time period and the audio level increases smoothly. The audio level is increased to its normal level.

At step S18, the audio decoder 78 monitors PTSs that are attached to the audio data and determines whether the current time that is based on the clock of the MPEG decoder 65 coincides with or has passed a PTS time. If determined that the current time has not reached a PTS time, the audio decoder 78 stands by until the current time reaches a PTS time.

On the other hand, if determined that the current time coincides with or has passed a PTS time, at step S19 the audio decoder 78 switches the switch 86 to the audio decoder side. At step S20, the audio signal is output from the speakers 17*a* and 17*b*.

At step S17, when the restart audio data is output while fading in, the audio volume reaches the normal level of the audio data at a time point when the current time reaches a PTS time. On the other hand, if the process has jumped to step S18 from step S13 in which case no restart audio data is being output, the audio signal starts to be output at a time point when the current time reaches a PTS time.

At step S20, the audio signal is output normally from the audio decoder 78. Then, the process returns to the audio signal output process for suspension and the audio signal output is continued until an instruction to stop the audio output is received.

Figure 9A:
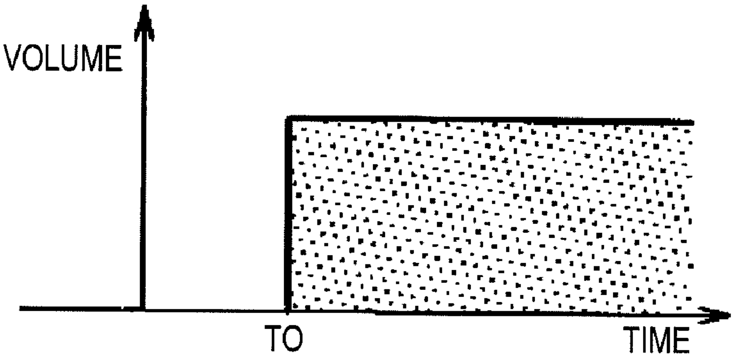
FIGS. 9A and 9B are graphs showing how the audio volume varies when audio output is restarted.
Figure 9B:
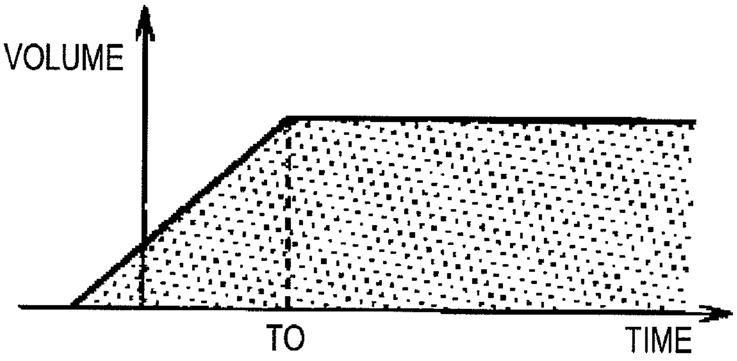

FIGS. 9A and 9B are graphs showing how the audio volume varies when audio output is restarted. The vertical axis represents the volume of audio that is output from the speakers 17*a* and 17*b* and the horizontal axis represents time.

When decoding is restarted and audio output is started at time t0, as shown in FIG. 9A, the volume increases abruptly to its normal level if no measure is taken. It is highly likely that this abrupt increase in volume causes the user of the computer auditory discomfort.

In contrast, in the PC 1 according to the embodiment which is equipped with the audio data generating module 80, even if audio output should be restarted at time t0, as shown in FIG. 9B, a head (decoding restart portion) audio signal can be output in advance (i.e., from a given time period before time t0) so as to fade in because restart audio data is stored in the buffer 83.

Therefore, the volume does not vary abruptly and the degree of auditory discomfort that the user suffers due to the variation in the receiving situation can be lowered.

According to the PC 1, even if audio signal output from the audio decoder 78 is suspended due to a variation in the receiving situation, audio that is continuous with audio that was output immediately before the suspension can be output. Furthermore, even if audio signal output from the audio decoder 78 is suspended, the PC 1 can stop the audio output after a smooth decrease in volume by decreasing the volume gradually using suspension audio data stored in the buffer 83.

When audio output should be restarted, audio can be output from before an original output time by using the buffer 83. The PC 1 can restart audio output smoothly by increasing the volume gradually using restart audio data that is generated from a head audio signal.

As such, even if audio output is suspended by errors in audio data, the PC 1 according to the embodiment can suspend and restart audio output without causing the user auditory discomfort.

In the embodiment, suspension or restart audio data is generated from an audio signal that is output from the audio decoder 78, and is stored in the buffer 83. An alternatively configuration is possible in which the line for directly supplying an audio signal from the audio decoder 78 to the speakers 17*a* and 17*b* is omitted and all portions of an audio signal including a portion for suspension or restart pass through the audio data generating module 80 (buffer 83).

The invention can be applied to not only apparatus which receive a digital TV broadcast signal and outputs a video signal and an audio signal but also apparatus which reproduce only a digital audio signal. Furthermore, the invention can be applied to not only apparatus which use a wireless transmission path but also apparatus which use a wired transmission line.

The invention can be applied to not only notebook personal computers (the case of the embodiment) but also various audio reproducing apparatus such as desktop computers, word processors, cell phones, audio apparatus, and communication apparatus.

Each process (series of steps) described in the embodiment can be performed either by software or by hardware.

Although in the embodiment the steps of each process are performed in time-series order as shown in the flowchart, the invention is not limited to such a case. Each process may include steps that are performed parallel or individually.

Although the embodiments according to the present invention have been described above, the present invention is not limited to the above-mentioned embodiments but can be variously modified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An audio reproducing apparatus comprising:

an audio output module configured to output an audio signal;

a receiver configured to receive a digital broadcast signal;

a demodulating module configured to demodulate the digital broadcast signal received by the receiver;

a decoder configured to decode digital broadcast signal demodulated by the demodulating module and to generate an audio signal;

a generating module configured to generate resuming audio data based on the audio signal of a given time period, the audio signal being output from the decoding module;

a storage module configured to store the resuming audio data generated by the generating module;

a switch configured to switch a source of the audio signal to be output from the audio output module between the decoder and the storage module; and a controller configured to control the switch to switch the source to the storage module for causing a leading part of the resuming audio data, which is stored after resuming the decoding, from among the resuming audio data stored in the storage module to be output while being faded-in, when the decoding by the decoding module is resumed after being suspended, wherein the audio signal that is applied with the decoding by the decoder is added with time information that indicates a time point to output the audio signal by the audio output module, and wherein the controller is configured to compare a difference time between a current time and the time information added to the audio signal output after the decoding is resumed and a time takes for the resuming audio data to be generated and output while being faded-in by the audio output module, when the decoding is resumed, and to control the switch to switch the source to the storage module and to cause the resuming audio data to be output while being faded-in when determined that the difference time is longer.

2. The audio reproducing apparatus of claim 1, wherein the controller is configured to control the switch to switch the source to the decoder in order to output the audio signal when a time to output the audio signal being resumed with the decoding has arrived while being determined that the difference time is shorter.

3. The audio reproducing apparatus of claim 1, wherein the generating module is configured to execute a frequency analysis on the audio signal of the given time period being applied with the decoding and to generate the resuming audio data and suspension audio data being configured by audio signal having thus obtained frequency component.

4. The audio reproducing apparatus of claim 2, wherein the generating module is configured to execute a frequency analysis on the audio signal of the given time period being applied with the decoding and to generate the resuming audio data and suspension audio data being configured by audio signal having thus obtained frequency component.

* * * * *